US010359970B2

(12) United States Patent
Pax et al.

(10) Patent No.: US 10,359,970 B2
(45) Date of Patent: *Jul. 23, 2019

(54) NON-VOLATILE MEMORY MODULE ARCHITECTURE TO SUPPORT MEMORY ERROR CORRECTION

(71) Applicant: Micron Technology, Inc., Boise, ID (US)

(72) Inventors: George Pax, Boise, ID (US); Jonathan Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/201,576

(22) Filed: Nov. 27, 2018

(65) Prior Publication Data

US 2019/0095131 A1 Mar. 28, 2019

Related U.S. Application Data

(63) Continuation of application No. 15/861,374, filed on Jan. 3, 2018, now Pat. No. 10,162,569, which is a (Continued)

(51) Int. Cl.
*G06F 11/00* (2006.01)
*G06F 3/06* (2006.01)
(Continued)

(52) U.S. Cl.
CPC ............ *G06F 3/0656* (2013.01); *G06F 3/061* (2013.01); *G06F 3/0619* (2013.01);
(Continued)

(58) Field of Classification Search
CPC .... G06F 3/0656; G06F 11/1072; G06F 3/061; G06F 3/0688; G11C 29/52; G11C 5/141
See application file for complete search history.

(56) References Cited

U.S. PATENT DOCUMENTS 5,260,949 A * 11/1993 Hashizume .... G01R 31/318558
714/731
5,347,465 A * 9/1994 Ferreri ................ G06F 17/5068
257/E27.105
(Continued)

FOREIGN PATENT DOCUMENTS

CN 108701090 A 10/2018
TW 201732831 A 9/2017
(Continued)

OTHER PUBLICATIONS

"International Application Serial No. PCT/US2017/013859, International Preliminary Report on Patentability dated Aug. 2, 2018", 13 pgs.
(Continued)

*Primary Examiner* — Esaw T Abraham
(74) *Attorney, Agent, or Firm* — Schwegman Lundberg & Woessner, P.A.

(57) ABSTRACT

Apparatus and methods are provided for operating a non-volatile memory module. In an example, a method can include filling a first plurality of pages of a first non-volatile memory with first data from a first data lane that includes a first volatile memory device, and filling a second plurality of pages of the first non-volatile memory device with second data from a second data lane that includes a second volatile memory device. In certain examples, the first plurality of pages does not include data from the second data lane.

20 Claims, 6 Drawing Sheets

Related U.S. Application Data continuation of application No. 15/000,812, filed on Jan. 19, 2016, now Pat. No. 9,891,864.

(51) Int. Cl.

| | | |
|---|---|---|
| *G06F 11/10* | (2006.01) | |
| *G11C 5/14* | (2006.01) | |
| *G11C 7/10* | (2006.01) | |
| *G11C 8/00* | (2006.01) | |
| *G11C 29/52* | (2006.01) | |
| *G06F 12/02* | (2006.01) | |
| *G11C 5/04* | (2006.01) | |
| *G11C 7/22* | (2006.01) | |
| *G11C 16/32* | (2006.01) | |
| *G11C 29/04* | (2006.01) | |

(52) U.S. Cl.
CPC .......... *G06F 3/0685* (2013.01); *G06F 3/0688* (2013.01); *G06F 11/1068* (2013.01); *G06F 11/1072* (2013.01); *G06F 12/0246* (2013.01); *G11C 5/04* (2013.01); *G11C 5/141* (2013.01); *G11C 7/10* (2013.01); *G11C 7/22* (2013.01); *G11C 8/00* (2013.01); *G11C 16/32* (2013.01); *G11C 29/52* (2013.01); *G06F 2212/1032* (2013.01); *G06F 2212/7202* (2013.01); *G11C 2029/0411* (2013.01); *G11C 2207/2245* (2013.01)

(56) References Cited

U.S. PATENT DOCUMENTS

| | | | | |
|---|---|---|---|---|
| 5,808,581 | A * | 9/1998 | Braisted | G01S 19/20 342/357.58 |
| 6,009,548 | A * | 12/1999 | Chen | G06F 11/1012 714/718 |
| 6,323,670 | B1 * | 11/2001 | Lee | G01R 1/0408 324/756.05 |
| 6,622,269 | B1 * | 9/2003 | Ngo | G11C 29/14 714/718 |
| 6,678,623 | B2 | 1/2004 | Koyama | |
| 6,990,603 | B2 | 1/2006 | Strasser | |
| 6,996,766 | B2 | 2/2006 | Cypher | |
| 7,093,183 | B2 * | 8/2006 | Chen | H03M 13/134 714/785 |
| 7,136,978 | B2 | 11/2006 | Miura et al. | |
| 7,162,569 | B2 | 1/2007 | Conley et al. | |
| 7,162,676 | B2 * | 1/2007 | Coleman | H03M 13/353 714/704 |
| 7,188,296 | B1 | 3/2007 | Cypher | |
| 7,337,373 | B2 | 2/2008 | O'brien et al. | |
| 7,412,627 | B2 * | 8/2008 | Bains | G11C 29/48 714/42 |
| 7,827,348 | B2 | 11/2010 | Lee et al. | |
| 7,924,022 | B2 | 4/2011 | Fujimoto | |
| 8,046,631 | B2 | 10/2011 | Jibbe et al. | |
| 8,086,783 | B2 | 12/2011 | O'connor et al. | |
| 8,090,988 | B2 | 1/2012 | Hoang | |
| 8,319,542 | B2 * | 11/2012 | Tamura | H03K 19/003 327/403 |
| 8,510,598 | B2 | 8/2013 | Vedder et al. | |
| 8,612,663 | B1 | 12/2013 | Lee | |
| 8,839,032 | B2 | 9/2014 | Walton et al. | |
| 9,147,027 | B2 * | 9/2015 | Lin | G06F 17/5081 |
| 9,183,085 | B1 | 11/2015 | Northcott | |
| 9,252,810 | B2 | 2/2016 | Fukuda | |
| 9,263,154 | B2 | 2/2016 | Tempel | |
| 9,342,423 | B2 | 5/2016 | Judd | |
| 9,400,311 | B1 * | 7/2016 | Malik | G01R 31/318342 |
| 9,430,606 | B2 | 8/2016 | Oberai | |
| 9,535,828 | B1 | 1/2017 | Mckelvie et al. | |
| 9,891,864 | B2 | 2/2018 | Pax et al. | |
| 2008/0147968 | A1 | 6/2008 | Lee et al. | |
| 2009/0292860 | A1 | 11/2009 | Park | |
| 2012/0297140 | A1 | 11/2012 | Wu et al. | |
| 2014/0244900 | A1 | 8/2014 | Tzeng et al. | |
| 2014/0258601 | A1 | 9/2014 | Ware et al. | |
| 2017/0206036 | A1 | 7/2017 | Pax et al. | |
| 2018/0129450 | A1 | 5/2018 | Pax et al. | |

FOREIGN PATENT DOCUMENTS

| | | |
|---|---|---|
| TW | I619121 B | 3/2018 |
| WO | WO-2017127386 A1 | 7/2017 |

OTHER PUBLICATIONS

"International Application Serial No. PCT/US2017/013859, International Search Report dated Apr. 19, 2017", 5 pgs.

"International Application Serial No. PCT/US2017/013859, Written Opinion dated Apr. 19, 2017", 11 pgs.

"Taiwanese Application Serial No. 106101763, Office Action dated Mar. 29, 2017", w/English translation, 24 pgs.

"Taiwanese Application Serial No. 106101763, Office Action dated Sep. 7, 2017", w/ English Translation, 18 pgs.

"Taiwanese Application Serial No. 106101763, Response filed May 17, 2017 to Office Action dated Mar. 29, 2017", w/English Claims, 71 pgs.

"Taiwanese Application Serial No. 106101763, Response filed Dec. 5, 2017 to Office Action dated Sep. 7, 2017", w/English Claims, 30 pgs.

\* cited by examiner

NON-VOLATILE MEMORY MODULE ARCHITECTURE TO SUPPORT MEMORY ERROR CORRECTION

PRIORITY APPLICATION

This application is a continuation of U.S. application Ser. No. 15/861,374, filed Jan. 2, 2018, now issued as U.S. Pat. No. 10,162,569, which is a continuation of U.S. application Ser. No. 15/000,812, filed Jan. 19, 2016, now issued as U.S. Pat. No. 9,891,864, all of which are incorporated herein by reference in their entireties.

BACKGROUND

As memory devices of all types have evolved, continuous strides have been made in improving their performance in a variety of respects. For example, the storage capacity of memory devices has continued to increase. This increased capacity, has allowed the development of ever more sophisticated applications and data structures. Many enterprises rely on computer systems that run around the clock to hold and have available critical data for the continued operation of the enterprise. Although highly robust, memory chips can fail. Without a backup plan, data stored on a failed memory chip can be of such critical importance to the operation of a computer system that significant system downtime can result if the information cannot be reassembled in a timely manner. Current memory devices can include volatile memory for normal operation and non-volatile memory for situations where information stored in volatile memory needs to be backed-up, such as when power to the volatile memory can be interrupted. Under such situations, data can be transferred from the volatile memory to the non-volatile memory for storage during the power disruption. Upon subsequent power restoration the data can be retrieved back to the volatile memory for fast storage and retrieval with a host system. Upon failure of a non-volatile memory component of the memory module, data associated with the failed memory component can be lost and the computer system can be rendered inoperable.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2 illustrates generally an example data lane to non-volatile memory page mapping for a memory device according to various examples of the present subject matter.

FIG. 5 illustrates generally an example data lane to non-volatile memory page mapping for a memory module according to various examples of the present subject matter.

DESCRIPTION OF THE EMBODIMENTS

The present inventors have recognized apparatus and methods for reliably storing and retrieving data within a non-volatile memory component of a memory module. In addition, stored data can be reconstructed using error correcting code (ECC) information such that if a non-volatile memory chip of the memory module fails, the data, or information, stored on the failed chip can be restored and the memory module or host system can mark the chip as failed and cease using the failed memory chip, whether volatile or non-volatile. Currently, non-volatile dual in-line memory modules (NVDIMM) transfer data to and from the non-volatile memory devices in a way that may not support memory error correction such as, but not limited to, ECC support, chip kill functionality or combinations thereof. The present subject matter, in addition to discussing the physical architecture of example NVDIMM also discusses data transfer schemes within memory modules that better support chip kill functionality. Chip kill functionality, in general, includes a chip kill algorithm executed by the host system that can use ECC information and the other valid data in the memory devices to reconstruct or restore data corrupted by a memory chip failure. Network server systems have included chip kill functionality such that a failed volatile memory chip can be identified by the host processor, the failed chip can be marked not to use, the corrupted data can be restored and remapped, and the system can continue to function until the failed non-volatile memory chip can be replaced. The present subject matter provides memory modules and methods that can extend chip kill functionality such that the host system can identify failed non-volatile memory devices, restore corrupted data resulting from the non-volatile memory device failure, and in certain examples, continue to operate the system until the non-volatile memory device can be replaced.

Figure 1:
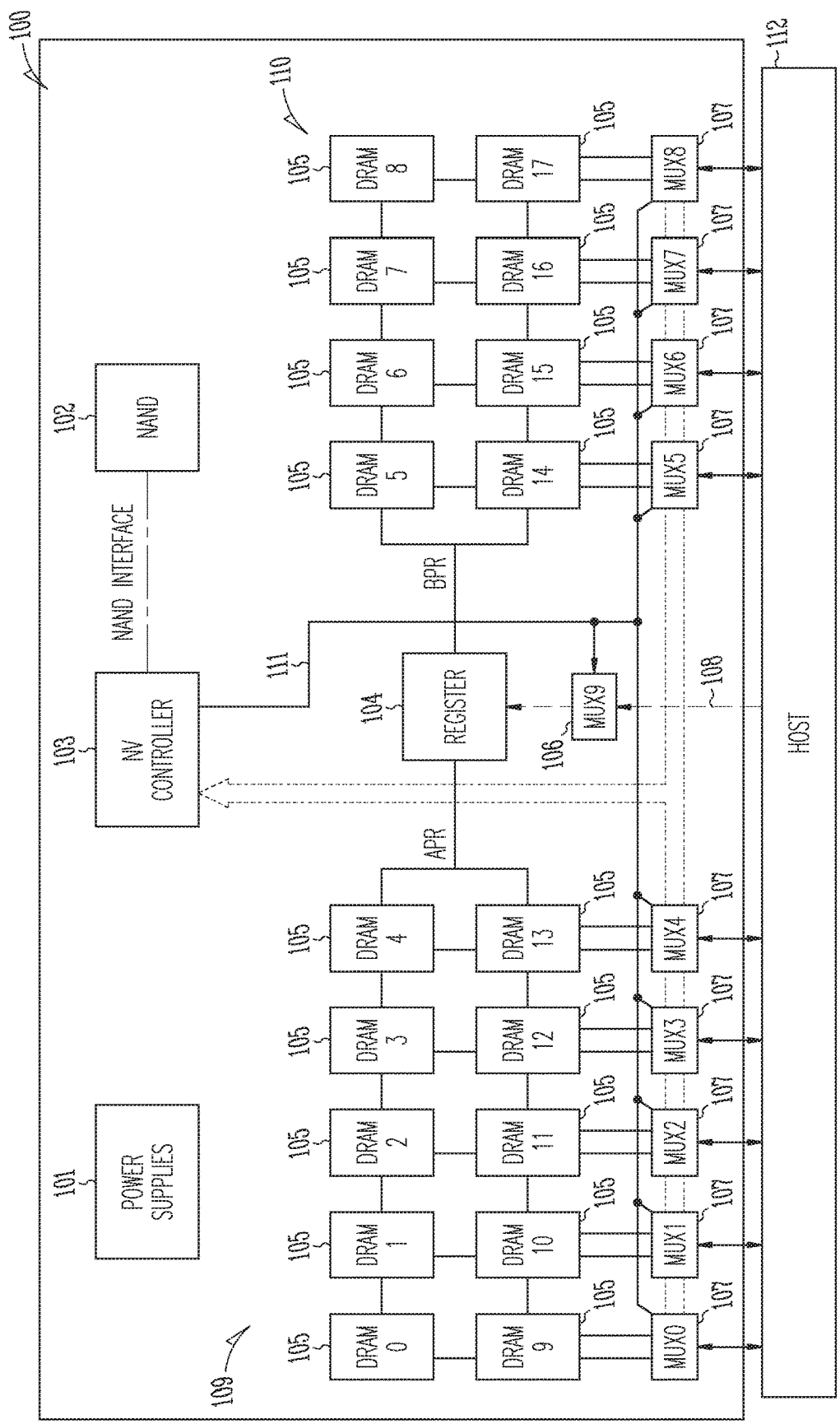
FIG. 1 illustrates generally an example memory module.

FIG. 1 illustrates generally an example memory module 100. In certain examples, the memory module 100 can include, a power supply 101, at least one non-volatile memory 102, a non-volatile memory controller 103, a register 104, a plurality of volatile memory devices 105 (e.g., dynamic random access memory (DRAM) devices), a control and address multiplexer 106, a plurality of data multiplexers 107, and a plurality of interconnects (APR, BPR, MDQ). In certain examples, the memory can be formed on a single printed-circuit board (PCB). In certain examples, when system power from a system power supply (not shown) is removed from the memory module 100, the memory device power supply 101 can provide sufficient power to allow data to be moved from the volatile memory devices 105 to the non-volatile memory 102. In certain examples, the power supply 101 or backup power source can include a battery. In some examples, the power supply 101 can include a capacitor. In certain examples, the memory module 100 is representative of either a DDR3 or a DDR4 memory module.

The non-volatile memory may be termed a "bank" having one or more individual non-volatile memory devices. For simplicity, the description herein will refer a "non-volatile memory or non-volatile memory device," with the understanding that in all cases the referenced non-volatile memory may be a bank of one or more individual non-volatile memory devices. In certain examples, the non-volatile memory 102 can save and maintain data when a power source external to the memory module 100 is removed. Examples of non-volatile memory devices can include, but are not limited to, charge storage type memories including various flash memory technologies such as NAND flash memories, magnetic random access memory (MRAM), spin-transfer torque random-access memory (STT-RAM), ferroelectric random-access memory (FeRAM), phase-change memory (PCM), resistive random-access memory (RRAM), or combinations thereof. In certain examples, the volatile memory devices 105 can include random access memory including, but not limited to, dynamic random access memory (DRAM) that can provide relatively faster read and write speeds for use by a host system (e.g., host processor). Such volatile random access memory typically cannot maintain stored data when system power is removed from the memory module 100. The register 104 can control access to the volatile memory devices 105.

When system power is present, the register 104 can receive command and address control information such as memory requests, for example, from the host system via a host command and address bus 108, and the command and address multiplexer 106. In certain examples, the host command and address bus 108 can be coupled to external connectors for control formed on the printed-circuit board. The register 104 can respond to command and address control information by controlling the volatile memory devices 105 to present data to the host or receive data from the host, via the data multiplexers 107 and an external connector, for storage in the volatile memory devices 105. In certain examples, error correction code (ECC) information can be routed by the register 104 for storage in the volatile memory devices 105.

Figure 3:
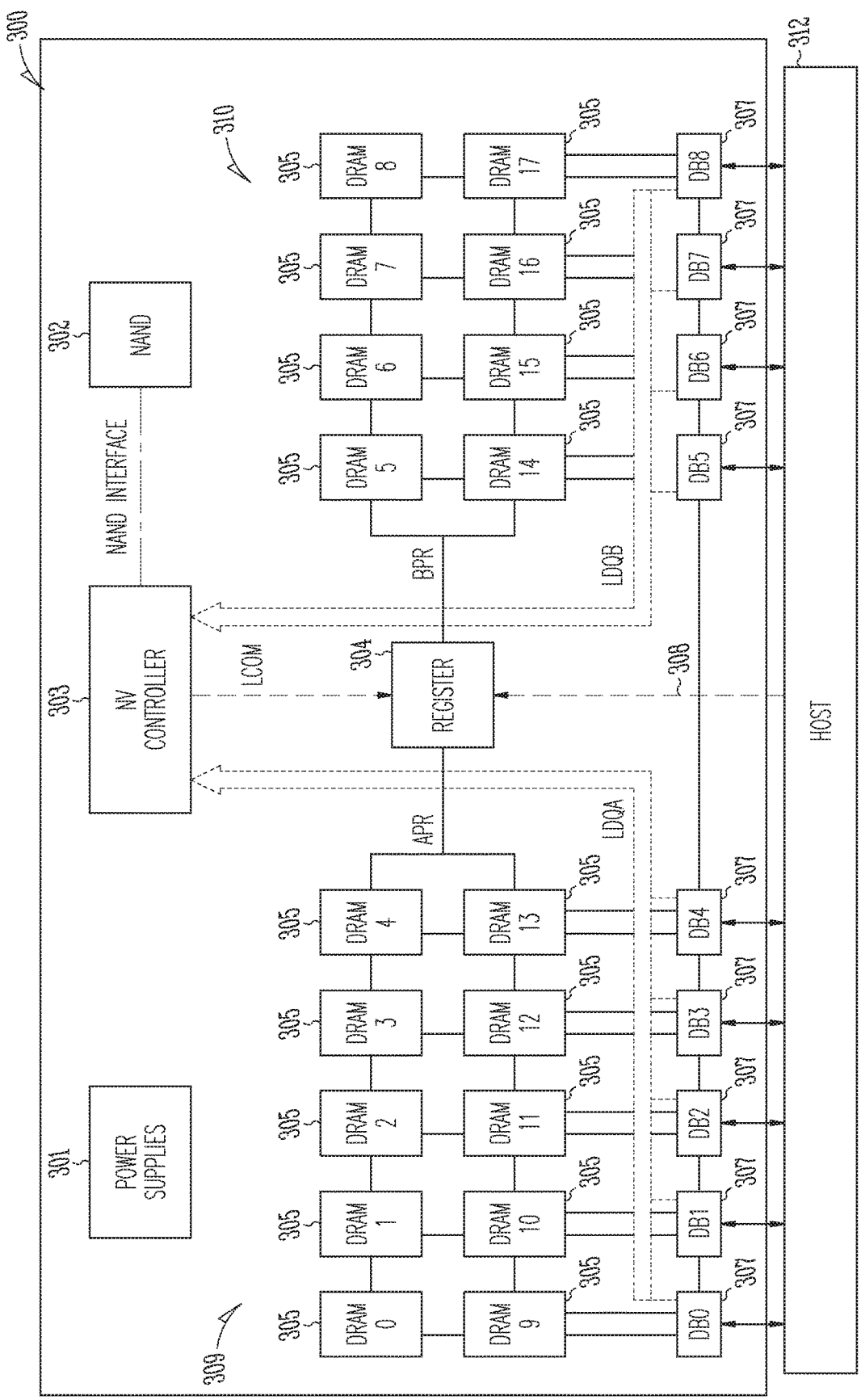
FIG. 3 illustrates generally an alternative example memory module.

In certain examples, the memory module 100 can include two volatile memory command and address buses (APR, BPR), each bus coupled to a respective block 109, 110 of multiple volatile memory devices 105 and configured to transfer command and address control information to the volatile memory devices 105. In some examples, a first block 109 of volatile memory devices 105 can include five data lanes and a second block 110 of volatile memory devices 105 can include four data lanes. In certain examples, the register 104 can provide command and address control information to the volatile memory devices 105 to retrieve data requested by the host system or hold data provided by the host system. As used herein, a data lane is defined as a data channel that includes a data communication path and associated volatile memory associated with transferring data to and from a non-volatile memory controller. The number of data lanes in a memory module can be influenced by the number of volatile memory devices in the memory module, the number of memory modules that can simultaneously connect with the host data bus or connector, the size of the host data bus or connector interfacing with the memory module, the bit length of a data word associated with the volatile memory devices, or combinations thereof. In the examples of FIGS. 1 and 3, a data lane or data channel includes the memory and data path associated with a plurality of volatile memory devices to communicate with a host data bus. In the depicted example configurations, the data path further includes either a plurality of data multiplexers (FIG. 1), or a plurality of data buffers (FIG. 3) that can simultaneously communicate with a host data bus to facilitate the described communication therewith. In certain examples, a byte lane can be associated with one or more volatile memory devices (DRAM X, DRAM X+9) that can communicate with a host data bus via a corresponding data multiplexer (FIG. 1, MUX X) or a data buffer (FIG. 3, DBX). In certain examples, each data lane can be a 4-bit wide data lane (nibble lane). In some examples, each data lane can be 8-bit wide data lane (byte lane). It is understood that other data lane bit widths are possible without departing from the scope of the present subject matter.

In certain examples, the non-volatile memory controller 103 can control movement of data between the volatile memory devices 105 and the non-volatile memory device 102. For example, upon system power loss, the non-volatile memory controller 103 can switch the command and address multiplexer 106 to allow the register 104 to receive command and address control information from the non-volatile memory controller 103 via a second command and address bus 111 instead of from the host system or host processor. The register 104 can then assist in controlling movement of data from the volatile memory devices 105 to a data bus (MDQ) that can couple the volatile memory devices 105 with the non-volatile memory controller 103. Data can be moved from the volatile memory devices 105 to the non-volatile memory controller 103 using the data bus (MDQ). In certain examples, the non-volatile memory controller 103 can provide routing information to the plurality of data multiplexers 107 so that the data from the volatile memory devices 105 is routed to the data bus (MDQ) and not to the host system or processor. In certain examples, the register 104 and the non-volatile memory controller 103 can cooperate to organize data storage in at least the non-volatile memory device 102 to allow for chip kill functional system if the host system includes a chip kill algorithm. As data is received at the non-volatile memory controller, the non-volatile memory controller moves the data to the non-volatile memory device along with signaling to initiate programming of the non-volatile memory of the non-volatile memory device.

In certain examples, the memory module 100 can include an additional non-volatile memory devices (not shown) such as an EPROM that includes parameters that describe the memory device. In certain systems, the host can read the parameters stored on the EPROM and, upon recognizing that the memory module 100 has a NVDIMM architecture, can monitor and provide certain signals specific to the memory module 100. For example, the host may monitor the system power supply and provide a signal to the memory module 100 when an abnormality is detected. The memory module 100 can optionally use a state of the signal to initiate saving the data on the volatile memory devices 105 to the non-volatile memory device 102. In certain examples, a second state of the signal can initiate restoring the volatile memory data from the non-volatile memory.

In systems that use memory modules, such as those illustrated in FIGS. 1 and 3, the host processor, or processors, can store or hold data, including ECC information, in volatile memory. A system with chip kill functionality can allow reconstructing data of a failed volatile memory device 105 if the lost data does not represent a significant amount of sequential data. Existing methods of using a memory module can transfer data stored in volatile memory to the non-volatile memory. Such methods can include reading sequential data and ECC information simultaneously from each volatile memory data lane and storing the data and ECC information in the non-volatile memory device. More specifically, the non-volatile controller moves data in parallel from all the volatile memory data lanes to the non-volatile controller and then to a page of the non-volatile memory device. As the information is received at the non-volatile memory device, the information is sequentially programmed on a page of the non-volatile memory. If a page of non-volatile memory is lost due to a non-volatile memory chip failure, a large chuck of sequential data and ECC information is lost. Because the data and ECC information represents a large chunk of sequential information, the information is not recoverable even in a system that supports chip kill.

As discussed above, chip kill functionality can allow recovery of data if there is a limited number of bit failures within a chuck of consecutive data. A system with chip kill functionality can allow reconstructing data of a failed memory chip, such as a failed volatile memory device 105, if the lost data does not represent a significant amount of sequential data. In certain examples of the present subject matter, the chip kill functionality that a system can have to identify and correct volatile memory failures can be extended to identify and correct data corrupted due to failures in the non-volatile memory device 102. Typical failures of a non-volatile memory device include page failures. In certain examples, the chip kill functionality can be extended to the non-volatile memory device 102 by organizing the data stored in the non-volatile memory device 102 as the data is organized in the volatile memory devices 105 such that each page of the non-volatile memory device 102 includes small, non-continuous chucks of data from only one data lane of the volatile memory devices 105.

Upon power being re-established to the memory module 100, the non-volatile memory controller 103 can retrieve data from the pages of the non-volatile memory device 102 and route the data to proper volatile memory devices 105. If a page failure occurs, the corrupted data from that page can be transferred from the page to the volatile memory devices 105. As is shown below, if the data is organized within the non-volatile memory device 102 according to the present subject matter, the corrupted data will map to a single data lane of the volatile memory. When the host detects corrupted data in the volatile memory after a transfer from the non-volatile memory, the host can employ the chip kill algorithm and the data can be corrected.

Figure 2:
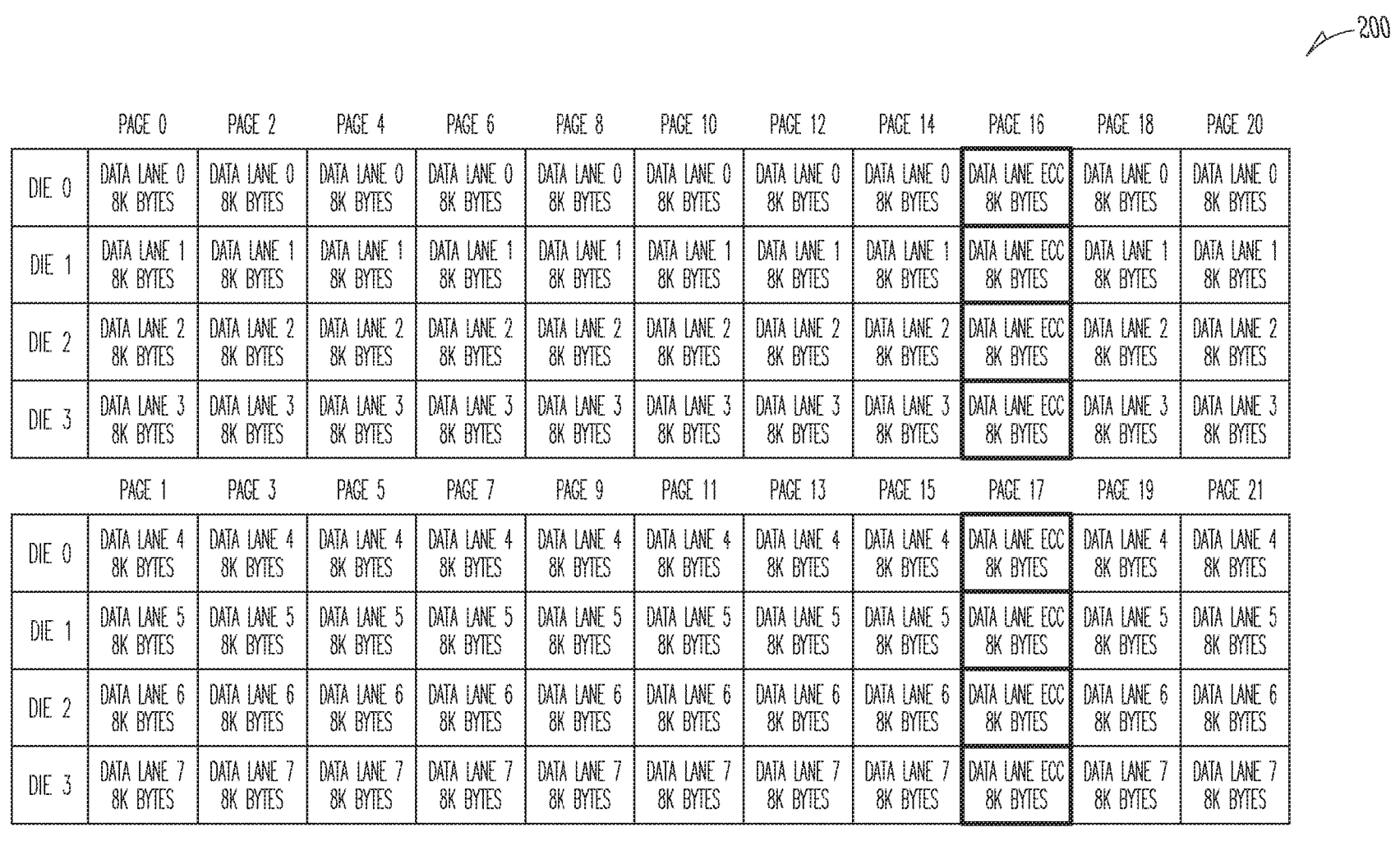

FIG. 2 illustrates generally an example data lane to non-volatile memory page mapping 200 for a memory module according to various examples of the present subject matter. In certain examples, a non-volatile memory controller can manage data storage such that each page of each die of the non-volatile memory device receives data from only one data lane (Data lane 0 . . . 7) of the volatile memory. In certain examples, a data lane of volatile memory can be used to store the ECC information as data is written to or retrieved from the volatile memory devices. In some examples, the register can organize data movement with the host to make sure an EEC data lane (Data lane ECC) is used to store ECC information.

In certain examples, the data lanes of the volatile memory devices can be organized so that any page (Page 0 . . . 21) of any die of the non-volatile memory device includes only data from one data lane of the volatile memory. Such organization, upon failure of a non-volatile memory die, can allow chip kill functionality because even with a page failure of the non-volatile circuit, the chance that the number of errors within a consecutive chuck of data exceeds the chip kill algorithm recovery capability is reduced considerably. With reference to FIG. 2, an example method to achieve this organization of data is to read and load eight data lanes of data from the volatile memory devices to the non-volatile memory device. For the illustrated example, the eight data lanes can program 64 pages of an example non-volatile memory device that can accommodate 8 k bytes of data per page. After programming the 64 pages, the ECC data lane can be read and loaded to another 8 pages of the non-volatile memory device. If a page of data is corrupted because of a non-volatile memory failure, the chip kill functionality, executed by the system host, can allow normal operation of the system after restoring the data to the volatile memory. In addition to providing an example storage scheme that supports chip kill functionality, the example methods of transferring data between the volatile and non-volatile memories can also be more power efficient. Conventional NVDIMM data transfer schemes which can require power expenditures to both blocks of volatile memory. Certain examples of the present subject matter can limit power to a single block during transfer because data is transferred by data lane between the volatile and non-volatile memories of the memory module. In certain examples, addition signaling of the register or the non-volatile memory controller can be used to regulate power from the memory module power supplies such that power distribution can be regulated at the data lane level during data transfers between the volatile and non-volatile memories thereby providing additional power conservation. Additional signaling could, for example, be in the form of clock enable signals or chip enable signals extending from, for example, the non-volatile memory controller to each volatile memory device.

FIG. 3 illustrates generally an alternative example memory module 300. In certain examples the memory module 300 can include memory devices referred to a non-volatile load-reduced dual in-line memory modules (NVLRDIMM). In certain examples, the memory module 300 can include a power supply 301, a non-volatile memory device 302, a non-volatile memory controller 303, a register 304, a plurality of volatile memory circuits 305 such as dynamic random access memory (DRAM) circuits, a plurality of data buffers 307, and a plurality of interconnects (APR, BPR, LDQA, LDQB, LCOM, BCOM). In certain examples, when a system power supply (not shown) is removed from the memory module 300, the memory device power supply 301 can provide sufficient power to allow data to be moved from the volatile memory circuits 305 to the non-volatile memory device 302. In certain examples, the power supply 301 or backup power source for the memory module 300 can include a battery. In some examples, the power supply 301 can include a capacitor. In certain examples, the memory module is representative of a DDR4 memory module.

In certain examples, the non-volatile memory device 302 can save and maintain data when a main power source is removed. Examples of non-volatile memory devices can include, among others, flash memory including NAND or NOR flash memories. In certain examples, the volatile memory circuit 305 can include dynamic random access memory (DRAM) that can provide exceptional read and write speeds for use by a host processor or host system. Unfortunately, in many examples, such volatile memory circuits 305 cannot maintain stored data when system power is removed from the memory module 300 for even a relatively short interval. The register 304 can control access to the volatile memory circuits 305. When system power is present, the register can receive memory requests from the host system via a host command and address bus 308. The register 304 can respond to command and address control information by controlling the volatile memory circuits 305 and the data buffers 307 to present data to the host or receive data from the host for storage in the volatile memory circuits 305. In certain examples, error correction code (ECC) information from the host can be stored in the volatile memory circuits 305.

In certain examples, the memory module 300 can include two volatile memory command and address buses (APR, BPR), each bus coupled to a respective block 309, 310 of multiple volatile memory circuits 305. In some examples, the a first block 309 of volatile memory circuits 305 can include five data lanes and a second block 310 of volatile memory circuits 305 can include four data lanes. In certain examples, the register 304 can provide command and address control information via the busses (APR, BPR) to the volatile memory circuits 305 to present and receive data with the host system. In the present example, a data lane is defined as the data communication path associated with transferring data to and from a pair of volatile memory circuits (DRAM X, DRAM X+9) via a corresponding data buffer (DB X).

In certain examples, the non-volatile memory controller 303 can control movement of data between the volatile memory circuits 305 and the non-volatile memory device 302. For example, upon system power loss, the register 304 can receive control and address information from the non-volatile memory controller 303 via a second control and address bus (LCOM) coupled directly between the register 304 and the non-volatile memory controller 303. Data can be moved from the volatile memory circuits 305 to the non-volatile memory controller 303 using a first data bus (LDQA) and a second data bus (LDQB). The first data bus (LDQA) can be coupled between the first block 309 of volatile memory circuits 305 and the non-volatile memory controller 303 and the second data bus (LDQB) can be coupled between the second block 310 of volatile memory circuits 305 and the non-volatile memory controller 303. In certain examples, the register 304 can provide routing information via a data buffer bus (BCOM) to the plurality of data buffers 307 so that the data is routed to either the first or second data bus (LDQA, LDQB) and not the host system or processor.

In certain examples, the register 304 and the non-volatile memory controller 303 cooperate to organize the data storage in at least the non-volatile memory device 302 to allow for chip kill functionality to identify chip failures of the non-volatile memory device. Chip kill functionality allows maintaining or reconstructing data of a failed memory chip such as a failed volatile memory chip such that the memory module 300 can continue to function as efficiently as possible with one or more failed volatile memory devices 305. In certain examples, chip kill functionality can be available and maintained by preemptively organizing the data stored in the volatile and non-volatile memory such that each page of non-volatile memory includes data from only one data lane of the volatile memory.

Upon power being re-established to the memory module 300, the non-volatile memory controller 303 can retrieve data from the pages of the non-volatile memory device 302 and route the data to proper volatile memory devices 305. If a page failure of the non-volatile memory device 302 has occurred, the corrupted data from that page can be transferred from the page to the corresponding volatile memory device 305. As is shown below, if the data is organized according to the present subject matter, the corrupted data will map to a single data lane of the volatile memory. When the host detects corrupted data in the volatile memory after a transfer from the non-volatile memory, the host can employ the chip kill algorithm and the data can be restored.

Figure 4:
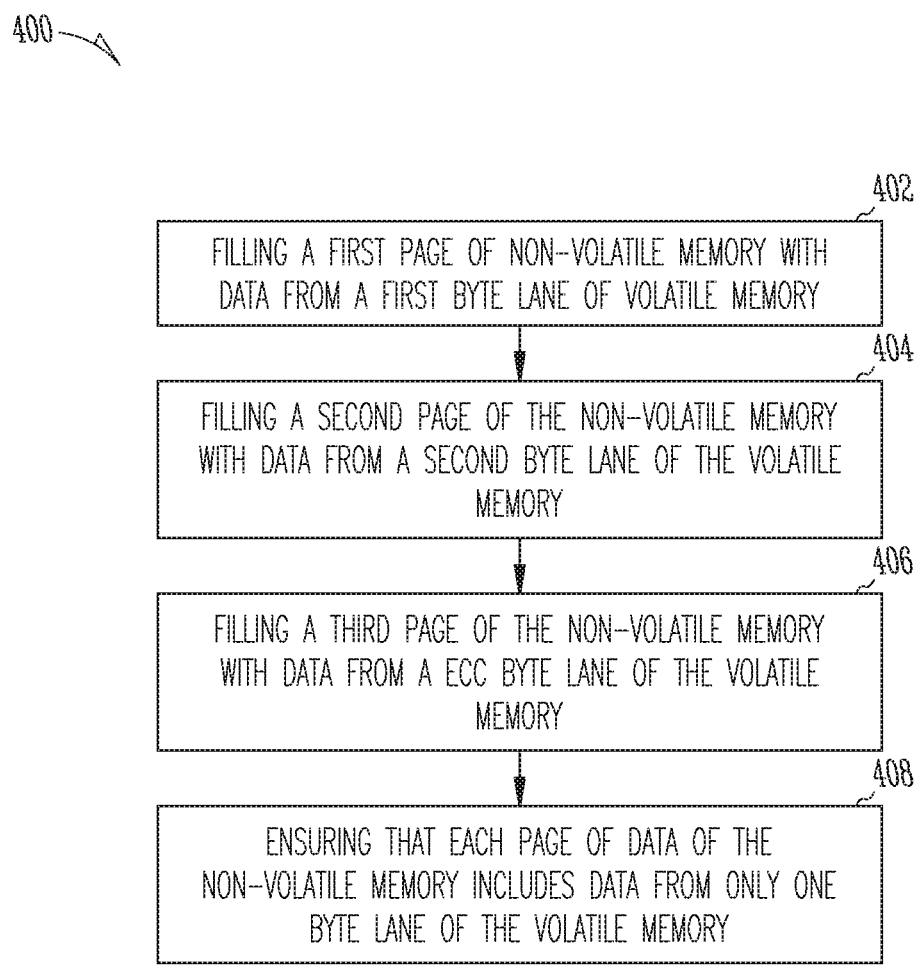
FIG. 4 illustrates generally a flowchart of an example method for transferring data between a volatile memory system and a non-volatile memory system.

FIG. 4 illustrates generally a flowchart of an example method for operating a memory module. At 402, a first plurality of pages of non-volatile memory of the memory module can be filled with data from a first data lane of dynamic random access memory of the memory module. At 404, a second plurality of pages of the non-volatile memory can be filled with data from a second data lane of the dynamic random access memory. In certain examples, the first plurality of pages and the second plurality of pages can be distinct from each other in that the pages do not overlap or share memory.

In certain examples, at 406, data from an error correction code (ECC) data lane of the volatile memory can be transferred to a third plurality of pages of the non-volatile memory. In certain examples, the third plurality of pages can be distinct from the first plurality of pages and from the second plurality of pages. In certain examples, at 408, the control of the transfer of data from the volatile memory to the non-volatile memory can assure that each page of data of the non-volatile memory includes data from only one data lane of the volatile memory. Such distinction can allow the memory module to have chip kill functionality. Chip kill functionality can allow data to be reconstructed when a memory chip fails such as a volatile memory chip. The present subject matter provides apparatus and methods to extend chip kill functionality to non-volatile memory devices of memory modules such that data can be reconstructed, and restored on failure of a non-volatile memory chip. Upon restoration, the memory module can continue to operate with the failed chip, thus, preventing unscheduled downtime on the system. For server systems that are counted on to run for extended periods between planned maintenance intervals, the prevention of downtime from unexpected memory failures can provide an overwhelming competitive advantage. In certain examples, filling each page of the non-volatile memory can include transferring data from a first data lane of the volatile memory to the non-volatile memory device via a non-volatile memory controller coupled to the non-volatile memory device. In some examples, filling pages of the non-volatile memory can includes isolating a host command and address bus from a register of the memory module. In some examples, the host command and address bus can be isolated from the host using a command and address multiplexer. In certain examples, filling the pages of the non-volatile memory can include coupling the register to a second command and address bus of the memory module using the command and address multiplexer. The second command and address bus can be coupled between the register and the non-volatile memory controller. In some examples, a pair of data buses can be used to transfer data from the volatile memory to the non-volatile memory controller.

Figure 5:
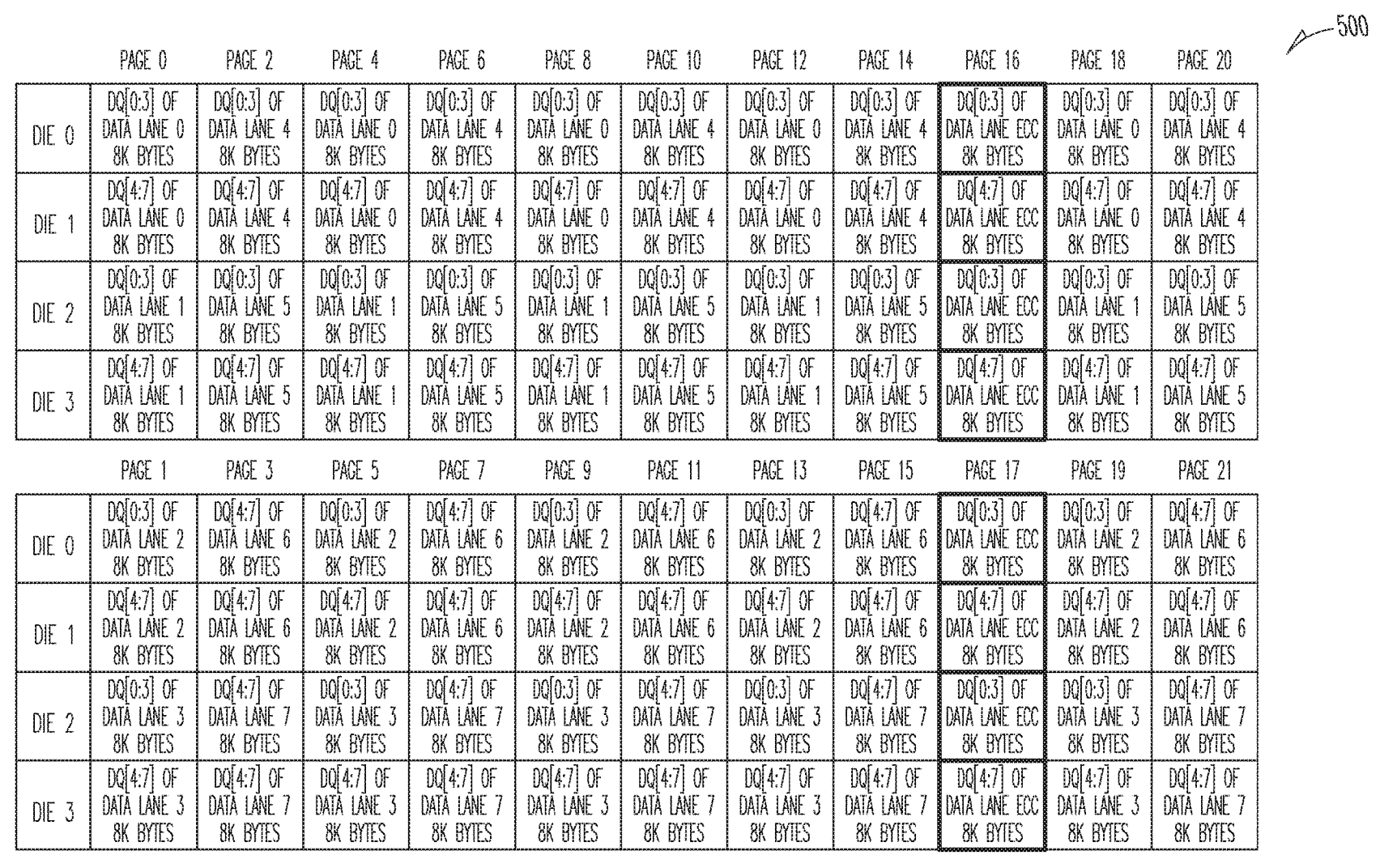

FIG. 5 illustrates generally an example data lane to non-volatile memory page mapping 500 for a memory module according to various examples of the present subject matter. In certain examples, a non-volatile memory controller can manage data storage such that each page of each die of the non-volatile memory device receives data associated with only certain bits of one data lane (Data lane 0 . . . 7) of the volatile memory. In certain examples, a data lane of volatile memory can be used to store the ECC information as data is written to or retrieved from the volatile memory devices. In some examples, the register can organize data movement with the host to make sure an EEC data lane (Data lane ECC) is used to store ECC information.

In certain examples, the data lanes of the volatile memory devices can be organized so that any page (Page 0 . . . 21) of any die (DIE 0, . . . , DIE 3) of the non-volatile memory device includes data associated with certain bits of one data lane of the volatile memory. In the example of FIG. 5, data associated with the lower four data bits (DQ[0:3]) of a data lane can be programmed to a first page of non-volatile memory and data associated with the upper four data bits (DQ[4:7]) of the data lane can be programmed to a separate second page of non-volatile memory. Such organization, upon failure of a non-volatile memory die can allow chip kill functionality because even with a page failure of the non-volatile circuit, the chance that the number of errors within a consecutive chuck of data exceeds the chip kill recovery algorithm capability is reduced considerably. With reference to FIG. 5, an example method to achieve this organization of data is to read and load eight data lanes of data from the volatile memory devices to the non-volatile memory device. For the illustrated example, the eight data lanes can program 64 pages of an example non-volatile memory device that can accommodate 8 k bytes of data per page. The ECC data lane can be read and loaded to another 8 pages of the non-volatile memory device. If a page of data is corrupted because of a non-volatile memory failure, upon power-up of the memory module, the non-volatile memory controller can move data from the non-volatile memory device to the volatile memory devices including attempting to write the data of the failed page to the corresponding data lane. As the host system begins to use the memory module and recognizes corrupted data, the chip kill algorithm of the host can reconstruct the corrupted data and upon restoration of the data, can allow normal operation of the system.

In certain examples, in addition to providing an example storage scheme that supports chip kill functionality for failed non-volatile memory pages, the example methods of transferring data between the volatile and non-volatile memories can also be more power efficient. Conventional NVDIMM data transfer schemes can require power expenditures to both blocks of volatile memory during the transfer interval. Certain examples of the present subject matter can limit power to a single block during transfer portions of the transfer interval because data is transferred by individual data lane between the volatile and non-volatile memory controller of the memory module. In certain examples, addition signaling of the register or the non-volatile memory controller can be used to regulate power from the memory module power supplies such that power distribution can be regulated at the data lane level during data transfers between the volatile and non-volatile memories thereby providing additional power conservation. Additional signaling could, for example, be in the form of clock enable signals or chip enable signals extending from, for example, the non-volatile memory controller to each volatile memory device.

Figure 6:
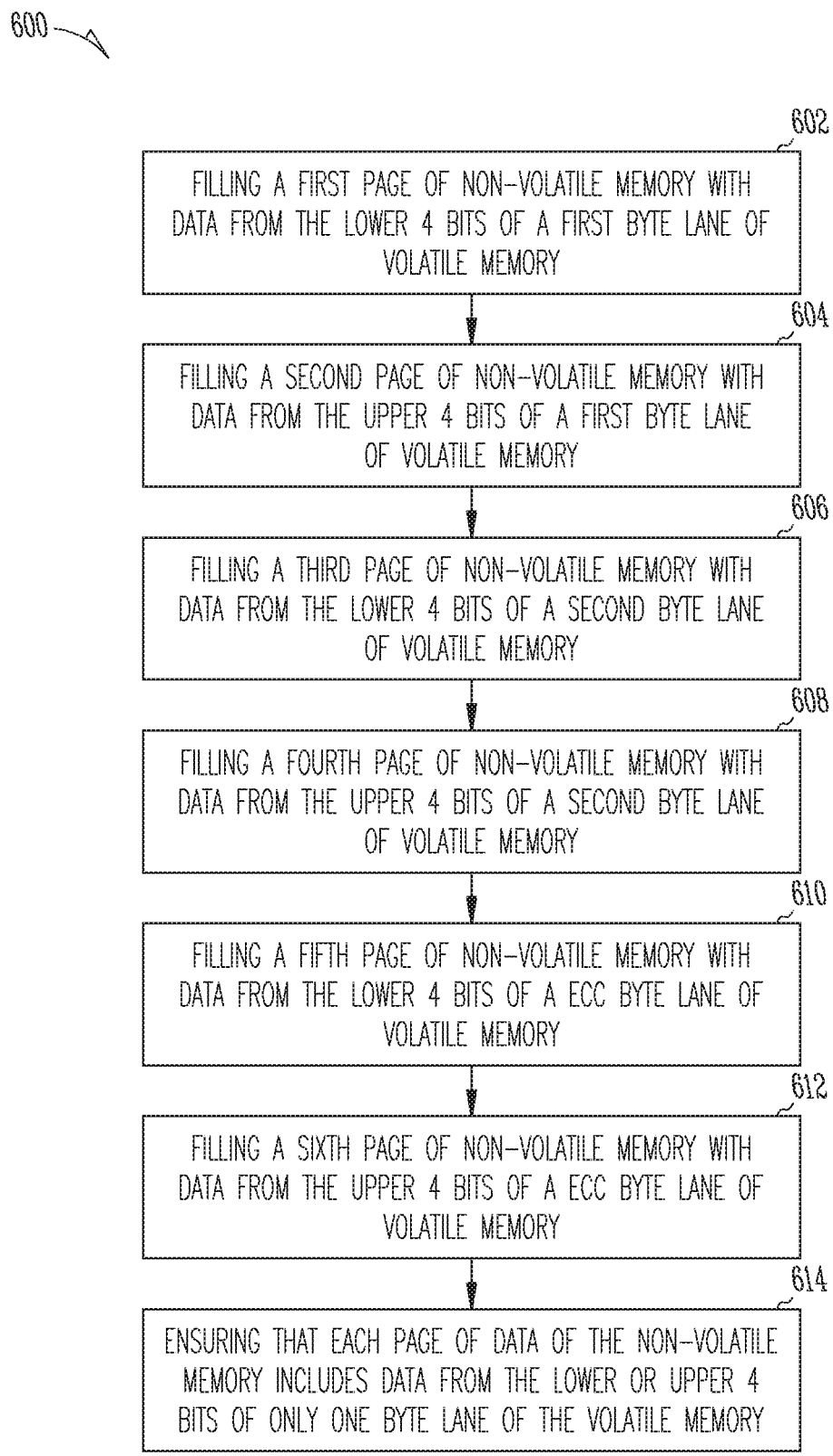
FIG. 6 illustrates generally a flowchart of an example method for transferring data between a volatile memory system and a non-volatile memory system.

FIG. 6 illustrates generally a flowchart of an example method 600 for operating a memory module. At 602, a first page of non-volatile memory of the memory module can be filled with data from the lower bits, such as the lower four bits, of a first data lane of dynamic random access memory of the memory module. This particular example is drawn towards volatile memory devices that can move 8 bits of data at each data lane, however, the scope of the present subject matter is not so limited. At 604, a second page of the non-volatile memory can be filled with data from the upper four bits of the first data lane of the dynamic random access memory. At 606, a third page of non-volatile memory of the memory module can be filled with data from the lower bits of a second data lane of dynamic random access memory of the memory module. At 608, a fourth page of the non-volatile memory can be filled with data from the upper four bits of the second data lane of the dynamic random access memory. In certain examples, each of the first, second, third and fourth pages of the non-volatile memory device can be distinct from each other in that the pages do not overlap or share memory.

In certain examples, at 610, data from the lower four bits of an error correction code (ECC) data lane of the volatile memory can be transferred to a fifth page of the non-volatile memory. At 612, data from the upper four bits of an error correction code (ECC) data lane of the volatile memory can be transferred to a sixth page of the non-volatile memory. In certain examples, the fifth and sixth pages of non-volatile memory can be distinct from the first thru fourth pages as well as being distinct from each other. In certain examples, at 614, the control of the transfer of data from the volatile memory to the non-volatile memory can assure that each page of data of the non-volatile memory includes data from only one data lane of the volatile memory. Such distinction can allow the memory module to have chip kill functionality or non-volatile memory failures. In certain examples, filling each page of the non-volatile memory can include transferring data from a first data lane of the volatile memory to the non-volatile memory device via a non-volatile memory controller coupled to the non-volatile memory device. In some examples, filling pages of the non-volatile memory can include isolating a host command and address bus from a register of the memory module. In some examples, the host command and address bus can be isolated from the host using a command and address multiplexer. In certain examples, filling the pages of the non-volatile memory can include coupling the register to a second command and address bus of the memory module using the command and address multiplexer. The second command and address bus can be coupled between the register and the non-volatile memory controller. In some examples, a pair of data buses can be used to transfer data from the volatile memory to the non-volatile memory controller.

EXAMPLES AND NOTES

The present subject matter can be described by way of several non-limiting examples. Some of these will now be listed in the following paragraphs.

In Example 1, A method can include filling a first plurality of pages of a first non-volatile memory with first data from a first data lane associated with a first volatile memory device and filling a second plurality of pages of the first non-volatile memory device with second data from a second data lane associated with a second volatile memory device. In certain examples, the first plurality of pages does not include the data from the second data lane.

In Example 2, the method of Example 1 optionally includes providing host command and address information from a host so that each of the first volatile memory device and the second volatile memory device perform normal operations in response to the host command and address information, and wherein each of the filling the first plurality of pages and the filling the second plurality of pages is performed in response to a command and address information provided from a memory controller that is distinct from the host.

In Example 3, the method of any one or more of Examples 1-2 optionally includes selecting one of the host command and address information and the command and address information provided from the memory controller by a command and address multiplexer.

In Example 4, the method of any one or more of Examples 1-3 optionally includes filling a third plurality of pages of the first non-volatile memory with error correction code information from an error correction data lane that includes a third volatile memory device, wherein the third plurality of pages is distinct from the first plurality of pages and from the second plurality of pages.

In Example 5, of the first data and the second data of any one or more of Examples 1-4 optionally is transferred to the first non-volatile memory through at least a common data bus.

In Example 6, the first data of any one or more of Examples 1-5 optionally is transferred to the first non-volatile memory through at least a first data bus, the second data of any one or more of Examples 1-5 optionally is transferred to the first non-volatile memory through at least second data bus, and the first data bus and the second data bus of any one or more of Examples 1-5 optionally are distinct.

In Example 7, each of the first data and the second data of any one or more of Examples 1-6 optionally includes lower data bits and upper data bits, each of the first pages of the first non-volatile memory of any one or more of Examples 1-6 optionally is configured to be filled with the lower data bits of the first data and each of the second pages of the first non-volatile memory of any one or more of Examples 1-6 optionally is configured to be filled with the lower data bits of the second data, and the method of any one or more of Examples 1-6 optionally includes filling a plurality of first pages of a second non-volatile memory with the upper data bits of the first data, and filling a plurality of second pages of the second non-volatile memory with the upper data bits of the second data.

In Example 8, each of the first plurality of pages of any one or more of Examples 1-7 optionally is configured to include only information received from the first data lane to preserve chip kill functionality.

In Example 9, each of the second plurality of pages of any one or more of Examples 1-8 optionally is configured to include only information received from the second data lane to preserve chip kill functionality.

In Example 10, the third plurality of pages of any one or more of Examples 1-9 optionally is configured to include only error correction code information received from the error correction data lane to preserve chip kill functionality.

In Example 11, a memory system can include a non-volatile memory including a plurality of memory pages, a plurality of volatile memory devices arranged in plurality of data lanes, each of the volatile memory devices being associated with one data lane of the plurality of data lanes, and a controller configured to store data to the plurality of memory pages of the non-volatile memory such that each of the plurality memory pages includes data provided from a single data lane of the plurality of data lanes without including data from others of the plurality of data lanes.

In Example 12, one or ones of the volatile memory devices of any one or more of Examples 1-11 optionally is configured to hold error correction code information and the rest of the volatile memory devices do not hold any error correction code information.

In Example 13, the memory system of any one or more of Examples 1-12 optionally includes a plurality of first external connectors configured to receive first control information and a register. The controller can be configured to provide second control information, and the register is configured to control operations of the volatile memory devices in response to selected one of the first control information and the second control information.

In Example 14, each of the data lanes of any one or more of Examples 1-13 optionally includes a data multiplexer coupled to a respective volatile memory device.

In Example 15, each of the data lanes of any one or more of Examples 1-14 optionally includes a data buffer coupled to a respective volatile memory device.

In Example 16, the memory system of any one or more of Examples 1-15 optionally includes a single printed-circuit board, and wherein the non-volatile memory, the volatile memory devices and the controller are mounted on the single printed-circuit board.

In Example 17, the memory system of any one or more of Examples 1-16 optionally includes a backup power source mounted on the single printed-circuit board and configured to provide a power to the non-volatile memory, the volatile memory device and the controller.

In Example 18, a system can include a processor configured to perform an error correction operation on data and a memory module coupled to the processor and configured to provide the data to the processor in a first operation mode. The memory module can include a non-volatile memory including a plurality of memory pages, a plurality of volatile memory devices configured to provide the data to the processor, the volatile memory devices being arranged in plurality of data lanes, each of the volatile memory devices being associated with one data lane of the plurality of data lanes, and a controller configured to store the data to the plurality of memory pages of the non-volatile memory in a second operation mode such that each of the plurality memory pages includes data provided from a single data lane of the plurality of data lanes without including data from others of the plurality of data lanes.

In Example 19, the error correction operation of any one or more of Examples 1-18 optionally includes a chip kill operation.

In Example 20, the memory module of any one or more of Examples 1-19 optionally includes a single printed-circuit board, and the non-volatile memory, the volatile memory devices and the controller are mounted on the single printed-circuit board.

In Example 21, the memory module of any one or more of Examples 1-20 optionally includes a backup power source mounted on the single printed-circuit board and configured to provide a power to the non-volatile memory, the volatile memory device and the controller.

Example 22, can include, or can optionally be combined with any portion or combination of any portions of any one or more of Examples 1 through 21 to include, subject matter that can include means for performing any one or more of the functions of Examples 1 through 21, or a machine-readable medium including instructions that, when performed by a machine, cause the machine to perform any one or more of the functions of Examples 1 through 21.

The above Description of Embodiments includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

The flowchart and block diagrams in the figures illustrate the architecture, functionality, and operation of possible implementations of systems, methods and computer program products according to various aspects of the present disclosure. In this regard, each block in the flowchart or block diagrams can represent a module, segment, or portion of code, which comprises one or more executable instructions for implementing the specified logical function(s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The functions or processes described herein can be implemented in software, hardware, human implemented procedures, or a combination thereof. The software can consist of computer executable instructions stored on computer readable media such as memory or other type of storage devices. The term "computer readable media" is also used to represent any means by which the computer readable instructions can be received by the computer, such as by different forms of wired or wireless transmissions. Further, such functions correspond to modules, which are software, hardware, firmware or any combination thereof. Multiple functions can be performed in one or more modules as desired, and the embodiments described are merely examples. The software can be executed on a digital signal processor, ASIC, microprocessor, or other type of processor operating on a computer system, such as a personal computer, server or other computer system. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. Also, in the above Description of Embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Description of Embodiments as examples or embodiments, with each claim standing on its own as a separate embodiment, and it is contemplated that such embodiments can be combined with each other in various combinations or permutations. The scope of the various embodiments of the invention should be determined with reference to the appended claims, along with the full scope of legal equivalents to which such claims are entitled.

What is claimed is:

1. An apparatus, comprising:
   a dynamic random access memory (DRAM);
   a non-volatile memory (NVM) coupled to the DRAM;
   a register that provides functionality to identify chip failure of the NVM associated with restoring data from the NVM to the DRAM following a loss of system power to the apparatus; and
   a controller configured to:
      receive, from a host device, a first command that is based at least in part on a loss of system power to the apparatus;
      transfer data from the DRAM to the NVM based at least in part on receiving the first command from the host device;
      receive, from the host device, a second command that is based at least in part on the system power to the apparatus being re-established;
      restore the data from the NVM to the DRAM upon receiving the second command from the host device;
      identify chip failure of the NVM in the register, the chip failure based at least in part on restoring the data from the NVM to the DRAM; and
      operate the apparatus based at least in part on the chip failure identified and according to instructions from a host device.

2. The apparatus of claim 1, wherein controller is configured to:
   adjust a bit of the register to indicate that the chip failure comprises an error in media of the NVM.

3. The apparatus of claim 1, wherein the controller is configured to:
   adjust a bit of the register to indicate that the chip failure comprises an error in the controller.

4. The apparatus of claim 1, wherein the controller is configured to:
   manage error correcting code (ECC) data on the apparatus;
   transfer ECC data to and restore ECC data from the NVM; and
   operate the apparatus based at least in part on the ECC data.

5. The apparatus of claim 1, further comprising a connector couplable to a backup power source.

6. The apparatus of claim 5, wherein the backup power source comprises at least one of a battery or a capacitor, or both.

7. The apparatus of claim 1, wherein the NVM comprises NAND flash.

8. The apparatus of claim 1, wherein the DRAM comprises DDR4 DRAM.

9. A method, comprising:
   transferring data from a first memory device of a n dual inline memory module (DIMM) to a second memory device of the DIMM upon a power loss, wherein the data is routed from the first memory device to the second memory device based at least in part on a configuration of the NVDIMM, and wherein the first memory device comprises a first type of memory media and the second memory device comprises a second type of memory media different from the first type of memory media;
   restoring the data from the second memory device to the first memory device upon power to the DIMM being re-established;

identifying a chip failure of the second memory device associated with restoring the data from the second memory device to the first memory device; and operating the DIMM based at least in part on the chip failure identified and according to instructions from a host device.

10. The method of claim 9, further comprising:

determining that the chip failure comprises an error in the second type of media, wherein one or more bits written in a register is indicative of the error in the second type of media.

11. The method of claim 9, further comprising:

determining that the chip failure comprises an error in a controller associated with the second memory device, wherein one or more bits written in a register is indicative of the error in the controller.

12. The method of claim 9, further comprising:

storing error correcting code (ECC) data on the first memory device, wherein the data transferred to the second memory device and restored to the first memory device comprises the ECC data; and operating the DIMM based at least in part on the ECC data.

13. The method of claim 9, further comprising:

receiving a first command from the host device that is based at least in part on the system power loss, wherein the data is transferred upon receiving the command; and receiving a second command from the host device that is based at least in part on the power to the DIMM being re-established, wherein the data is restored to the first memory device and a register is written following the second command.

14. The method of claim 9, wherein the data comprises corrupted data transferred from and restored to the first memory device.

15. The method of claim 9, wherein the first memory device comprises DRAM and the second memory device comprises NAND.

16. An apparatus, comprising:

a first memory device comprising a first type of memory media;

a second memory device comprising a second type of memory media that is different from the first type of memory media;

a register that provides functionality to identify chip failure of the second memory device associated with restoring data from the second memory device to the first memory device following a loss of system power to the apparatus; and a controller configured to:

transfer data from the first memory device to the second memory device based at least in part on device loss of system power to the apparatus while operating on power provided by the backup power source;

restore the data from the second memory device to the first memory device based at least in part on the system power to the apparatus being re-established;

identify chip failure of the second memory device in the register, the chip failure based at least in part on restoring the data from the second memory device to the first memory device; and operate the apparatus based at least in part on the chip failure identified.

17. The apparatus of claim 16, further comprising:

a backup power source configured to provide power to the apparatus during a loss of system power to the apparatus to allow data transfer from the first memory device to the second memory device.

18. The apparatus of claim 16, wherein the apparatus is configured to:

receive a first command from a host device, the first command based at least in part on the system power loss and the data is transferred upon receiving the command; and receive a second command from the host device, the second command based at least in part on the power to the DIMM being re-established and the data is restored to the first memory device and a register is written following the second command.

19. The apparatus of claim 16, wherein the controller is configured to:

determine that the chip failure comprises an error in the second type of media; and write to a register one or more bits indicative of the error in the second type of media.

20. The apparatus of claim 16, wherein the first memory device comprises DRAM.

* * * * *